US011515850B2

(12) United States Patent
Jo et al.

(10) Patent No.: US 11,515,850 B2
(45) Date of Patent: Nov. 29, 2022

(54) DISTRIBUTED AMPLIFIER

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/271,174

(22) PCT Filed: May 31, 2019

(86) PCT No.: PCT/JP2019/021793
§ 371 (c)(1),
(2) Date: Feb. 24, 2021

(87) PCT Pub. No.: WO2020/049813
PCT Pub. Date: Mar. 12, 2020

(65) Prior Publication Data
US 2021/0257979 A1    Aug. 19, 2021

(30) Foreign Application Priority Data
Sep. 4, 2018  (JP) .............................. JP2018-165110

(51) Int. Cl.
*H03F 3/60*    (2006.01)
*H03F 3/04*    (2006.01)

(52) U.S. Cl.
CPC .................... *H03F 3/605* (2013.01)

(58) Field of Classification Search
CPC .......... H03F 3/04; H03F 3/605; H03F 1/0261; H03F 1/22; H03F 2200/451
USPC ............................... 330/295, 124 R, 84, 286
See application file for complete search history.

(56) References Cited

U.S. PATENT DOCUMENTS

| 6,864,750 B2 * | 3/2005 | Shigematsu ............ H03F 1/223 330/311 |
| 2003/0011436 A1 | 1/2003 | Shigematsu |
| 2009/0009253 A1 | 1/2009 | Shigematsu |

FOREIGN PATENT DOCUMENTS

| JP | H05304428 A | 11/1993 |
| JP | 2003092523 A | 3/2003 |
| JP | 200641936 A | 2/2006 |
| JP | 2014175675 A | 9/2014 |
| WO | 2007108103 A1 | 9/2007 |

OTHER PUBLICATIONS

J. Chen, et al., "Design and Analysis of a Stage-Scaled Distributed Power Amplifier," IEEE Transactions on Microwave Theory and Techniques, vol. 59, No. 5, May 2011, 10 pages.

* cited by examiner

*Primary Examiner* — Hieu P Nguyen
(74) *Attorney, Agent, or Firm* — Slater Matsil, LLP

(57) ABSTRACT

In a distributed amplifier, a plurality of cascode amplifiers connected in parallel between an input side transmission line and an output side transmission line are provided, a transmission line is connected to an input terminal of an output transistor of each of the amplifiers, and a bias potential is applied from a bias circuit to the input terminal of the output transistor via the transmission line.

15 Claims, 16 Drawing Sheets

DISTRIBUTED AMPLIFIER

This patent application is a national phase filing under section 371 of PCT/JP2019/021793, filed May 31, 2019, which claims the priority of Japanese patent application no. 2018-165110, filed Sep. 4, 2018, each of which is incorporated herein by reference in its entirety.

TECHNICAL FIELD

The present invention relates to a distributed amplifier in which amplifiers configured with cascode stages are connected in parallel between an input side transmission line and an output side transmission line.

BACKGROUND

Broadband amplifiers are desired in various systems such as high-speed communication and high-resolution radar, and one example is a distributed amplifier. A distributed amplifier enables broadband signal amplification by incorporating a parasitic capacitance of a transistor into transmission lines of input and output sides to perform matching and matching propagation constants of the transmission lines between the input and output sides.

Conventionally, in order to further increase a band of a distributed amplifier, a configuration in which a cascode stage is used as an amplifier has been proposed (for example, see Non Patent Literature 1). FIG. 16 is a circuit diagram showing a conventional distributed amplifier. As shown in FIG. 16, the distributed amplifier 50 includes an input side transmission line W1, an output side transmission line W2, and N (N is an integer of 2 or more) amplifiers A1, A2, A3, . . . , and AN configured with cascode stages, which are connected in parallel between W1 and W2. The input side transmission line W1 has an input terminal Vin of the distributed amplifier 50 at one end thereof, and a port resistance RP1 (=50Ω) is connected to the other end. The output side transmission line W2 has an output terminal Vout of the distributed amplifier 50 at one end thereof, and a port resistance RP2 (=50Ω) is connected to the other end.

Generally, a cascode stage (a cascode circuit) is a circuit configuration in which two transistors of an upper stage and a lower stage that operate in a saturation region are longitudinally stacked, the upper stage is configured with a base (gate) grounded amplification circuit, and the lower stage is configured with an emitter (source) grounded amplification circuit.

The amplifier An (n=1, 2, 3, . . . , N) in FIG. 16 includes an NPN type input transistor Q1 (the lower stage) of which a base terminal is connected to an input terminal Vic via a capacitive element C1 and an emitter terminal is connected to a negative potential VEE, and an NPN type output transistor Q2 (the upper stage) of which an emitter terminal is connected to a collector terminal of Q1 and a collector terminal is connected to an output terminal Voc.

A bias potential Vb1 is applied to the base terminal of Q1 via a resistance element R1. Further, a bias potential Vb2 generated by a bias circuit B is applied to a base terminal of Q2. The bias circuit B includes resistance elements R2 and R3 (bleeder resistances) connected in series between the negative potential VEE and a ground potential GND (0 V), and a capacitive element C2 connected in parallel to R3 on the GND side. Vb2 obtained by performing resistance division with R2 and R3 is applied to the base terminal of Q2. C2 has a function of stabilizing Vb2.

CITATION LIST

Non Patent Literature

[NPL 1] Chen, Jiashu, and Ali M. Niknejad, "Design and analysis of a stage-scaled distributed power amplifier," IEEE Transactions on Microwave Theory and Techniques, VOL. 59.5, pp. 1274-1283, MAY 2011.

SUMMARY

Technical Problem

According to the conventional distributed amplifier described above, by using the cascode stage as the amplifier, influence of the Miller capacitance between the collector and the base of the input transistor is reduced so that wider band amplification can be obtained. However, there is a problem that a gain on a high frequency side decreases due to an increase in transmission line loss on the high frequency side of an operating signal frequency band, an increase in phase difference between signals propagating through input and output lines, etc. For that reason, it is difficult to realize a wider band amplifier.

Embodiments of the present invention are intended to solve such a problem, and an object of embodiments of the present invention is to provide a distributed amplifier in which a gain reduction on a high frequency side can be compensated for.

Means for Solving the Problem

In order to achieve such an object, a distributed amplifier according to embodiments of the present invention includes an input side transmission line configured to transmit an input signal that is an amplification target, an output side transmission line configured to transmit an output signal obtained by amplifying the input signal, and a plurality of amplifiers configured with cascode stages, which are connected in parallel between the input side transmission line and the output side transmission line, in which the amplifier includes an input transistor and an output transistor which are cascode-connected to each other, a transmission line or an inductor connected to a base terminal of the output transistor, and a bias circuit configured to apply a bias potential to the base terminal of the output transistor via the transmission line.

Effects of Embodiments of the Invention

According to embodiments of the present invention, on a high frequency side of an operating signal frequency band, impedance of the transmission line connected to the output transistor of the amplifier increases, and positive feedback is applied from an emitter terminal of the output transistor to a collector terminal thereof. For this reason, a peaking effect is obtained on the high frequency side of the operating signal frequency band, and as a result, a gain reduction on the high frequency side can be compensated for. Therefore, a wider band distributed amplifier can be realized.

DETAILED DESCRIPTION OF ILLUSTRATIVE EMBODIMENTS

Next, embodiments of the present invention will be described with reference to the drawings.

First Embodiment

Figure 1:
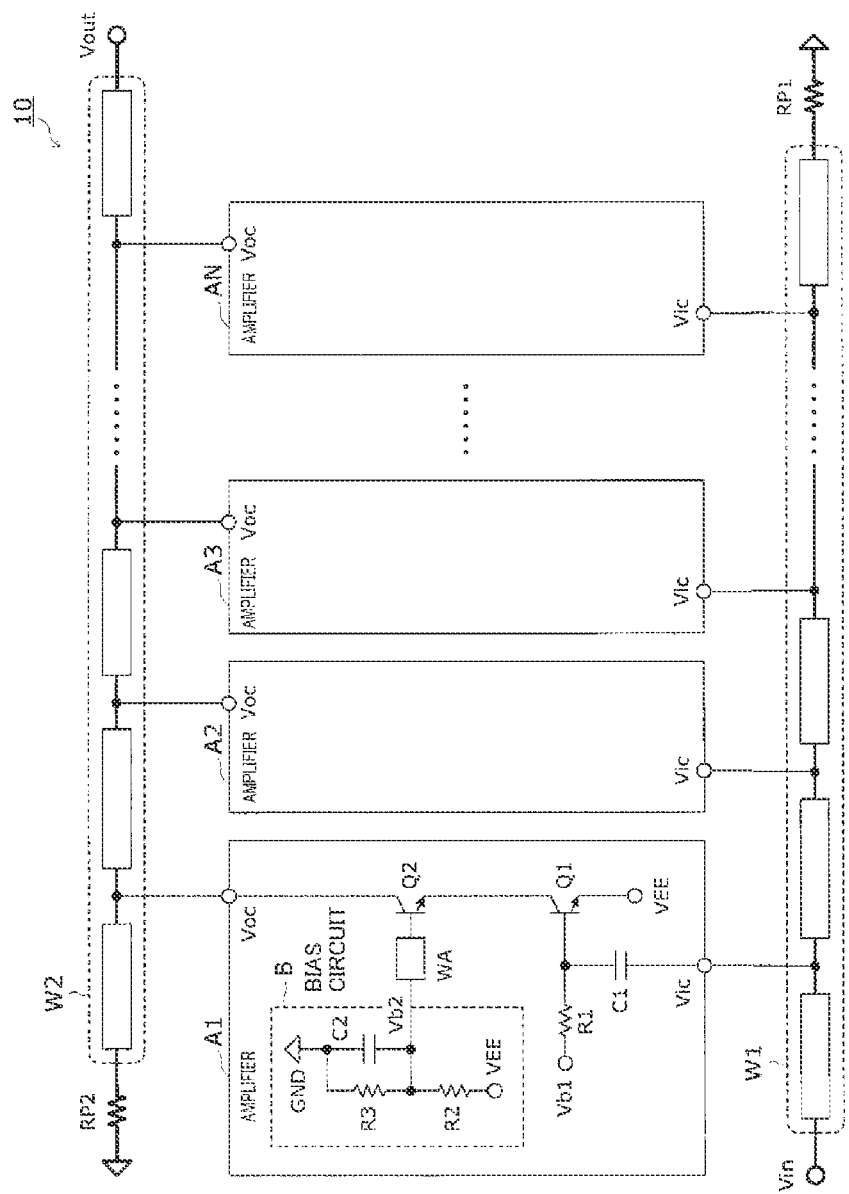
FIG. 1 is a circuit diagram showing a configuration of a distributed amplifier according to a first embodiment.

First, a distributed amplifier 10 according to a first embodiment of the present invention will be described with reference to FIG. 1. FIG. 1 is a circuit diagram showing a configuration of the distributed amplifier according to the first embodiment.

As shown in FIG. 1, the distributed amplifier 10 includes an input side transmission line W1, an output side transmission line W2, and N (N is an integer of 2 or more) amplifiers A1, A2, A3, . . . , and AN configured with cascode stages, which are connected in parallel between transmission lines W1 and W2.

Figure 16:
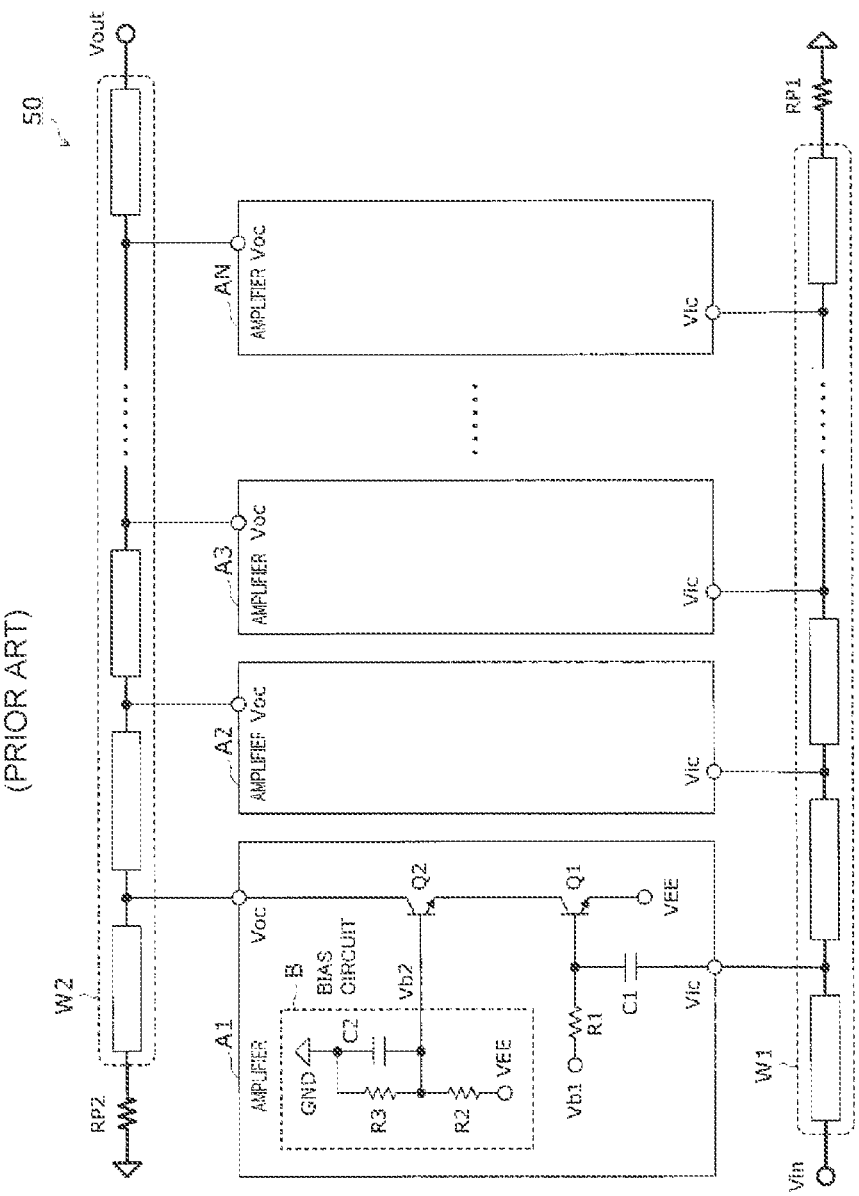
FIG. 16 is a circuit diagram showing a conventional distributed amplifier.

The distributed amplifier 10 according to the present embodiment is different from the conventional distributed amplifier 50 of FIG. 16 described above in that a transmission line WA is provided between a bias circuit B of each of the amplifiers An (n=1, 2, 3, . . . , and N) and a base terminal of an output transistor Q2.

The input side transmission line W1 is a line for transmitting an input signal that is an amplification target, and has an input terminal Vin of the distributed amplifier 10 at one end thereof and a port resistance RP1 (=50Ω) is connected to the other end. The output side transmission line W2 is a line for transmitting an output signal obtained by amplifying the input signal, and has an output terminal Vout of the distributed amplifier 10 at one end thereof, and a port resistance RP2 (=50Ω) is connected to the other end.

The amplifier An includes an input transistor Q1 and an output transistor Q2 which are cascode-connected to each other, the transmission line WA connected to an input terminal (a base terminal) of output transistor Q2, and the bias circuit B which applies a bias potential to the input terminal of output transistor Q2 via the transmission line WA.

Generally, a cascode stage (a cascode circuit) is a circuit configuration in which two transistors of an upper stage and a lower stage that operate in a saturation region are longitudinally stacked, the upper stage is configured with an emitter (source) grounded amplification circuit, and the lower stage is configured with a base (gate) grounded amplification circuit.

The amplifier An of FIG. 1 includes an NPN type input transistor Q1 (the lower stage) of which a base terminal is connected to the input terminal Vic via a capacitive element C1 and an emitter terminal is connected to a negative potential VEE, and an NPN type output transistor Q2 (the upper stage) of which an emitter terminal is connected to a collector terminal of input transistor Q1 and a collector terminal is connected to the output terminal Voc.

A bias potential Vb1 is applied to the base terminal of input transistor Q1 via a resistance element R1. A bias potential Vb2 generated by the bias circuit B is applied to the base terminal of output transistor Q2 via the transmission line WA. The bias circuit B includes resistance elements R2 and R3 (bleeder resistances) connected in series between the negative potential VEE and a ground potential GND (o V), and a capacitive element C2 connected in parallel to resistance element R3 on the GND side. The bias potential Vb2 obtained by performing resistance division with resistance elements R2 and R3 is applied to the base terminal of the output transistor Q2. The capacitive element C2 has a function of stabilizing the bias potential Vb2.

Figure 2:
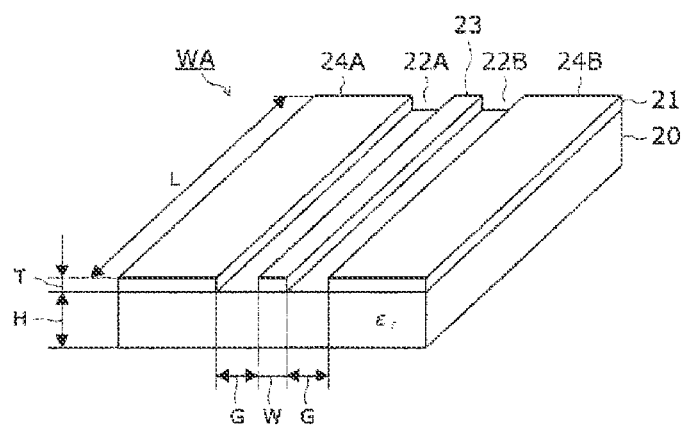
FIG. 2 is a configuration example of a coplanar waveguide calculator.

The transmission line WA is configured as a planar waveguide (high-frequency transmission line), such as a coplanar waveguide calculator (CWP), which is formed of a conductor film formed on a dielectric substrate used in an integrated circuit. FIG. 2 is a configuration example of the coplanar waveguide calculator. A CWP is a waveguide having a structure in which ground conductors 24A and 24B are formed on both sides of a linear signal conductor 23 formed on a surface of a dielectric substrate 20 via slots 22A and 22B, among planar waveguides. Specifically, as shown in FIG. 2, a conductor surface 21 having a thickness T is formed on only one surface of the dielectric substrate 20 having a thickness H, a length L, and a relative permittivity $\varepsilon_r$, and two slots (gaps) 22A and 22B having a gap width G are provided in the conductor surface 21 at intervals of a signal line width W. The conductor surface between the slots 22A and 22B serves as the signal conductor 23, and the conductor surfaces on both sides serve as the ground conductors 24A and 24B.

In addition, although a case in which NPN type bipolar transistors are used for transistors Q1 and Q2 will be described as an example in the present embodiment, the present invention is not limited thereto. For example, PNP type bipolar transistors may be used for transistors Q1 and Q2. Further, field effect transistors such as N-MOS and P-MOS may be used for transistors Q1 and Q2 instead of the bipolar transistors.

Operation of First Embodiment

Figure 3:
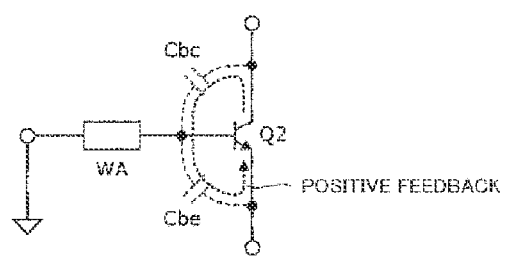
FIG. 3 is an explanatory diagram showing positive feedback in an output transistor of the amplifier.

Next, an operation of the distributed amplifier 10 according to the present embodiment will be described with reference to FIG. 3. FIG. 3 is an explanatory diagram showing positive feedback in the output transistor of the amplifier.

In the amplifier An, an input signal Sin from the input side transmission line W1 input to the input terminal Vic is applied to the base terminal of the input transistor Q1 after a DC potential is cut off by the capacitive element C1. The bias potential Vb1 is applied to the base terminal of input transistor Q1 via the resistance element R1, and the bias potential Vb2 generated by the bias circuit B is applied to the base terminal of the output transistor Q2.

As a result, since the base potential of output transistor Q2 is constant, an emitter potential of output transistor Q2 is also substantially constant. For this reason, input signal Sin is amplified by input transistor Q1 and then converted into an emitter current of output transistor Q2 and becomes a collector current of output transistor Q2, which is output from an output terminal Vio to the output side transmission line W2. In this case, since input transistor Q1 is a grounded-emitter amplifier circuit, a Miller effect occurs in which a parasitic capacitance Cbc between the base and the collector of input transistor Q1 is amplified by a gain of input transistor Q1. Since a load of input transistor Q1 serves as the emitter terminal of output transistor Q2 and a collector current of input transistor Q1 and the emitter current of output transistor Q2 are equal, the gain of input transistor Q1 becomes 1, and the Miller effect is greatly inhibited.

On the other hand, the transmission line WA connected between the bias circuit B and the base terminal of output transistor Q2 is configured as a planar waveguide such as a coplanar waveguide calculator, and has frequency characteristics in which impedance increases on a high frequency side of an operating signal frequency band.

For this reason, ground impedance of output transistor Q2 becomes relatively high on the high frequency side, and positive feedback is applied from the emitter terminal of output transistor Q2 to the collector terminal. This positive feedback is performed via the parasitic capacitance Cbc between the base and the collector and a parasitic capacitance Cbe between the base and the emitter of output transistor Q2, as shown in FIG. 3.

Therefore, a peaking effect can be obtained on the high frequency side of the operating signal frequency band, and as a result, a gain reduction on the high frequency side can be compensated for. Thus, a wider band distributed amplifier 10 can be realized.

Simulation Results of First Embodiment

Figure 4:
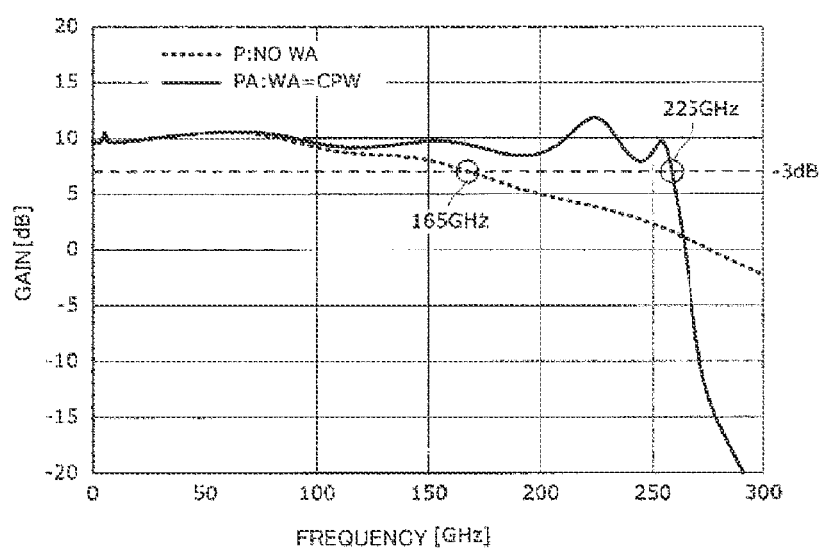
FIG. 4 is a graph showing frequency characteristics (S21) of the distributed amplifier according to the first embodiment.

Next, simulation results of the frequency characteristic of the distributed amplifier 10 according to the present embodiment will be described with reference to FIG. 4. FIG. 4 is a graph showing the frequency characteristic (S21) of the distributed amplifier according to the first embodiment.

In FIG. 4, a characteristic P shows a frequency characteristic of the conventional distributed amplifier 50 shown in FIG. 16, and a characteristic PA shows the frequency characteristic of the distributed amplifier 10 according to the present embodiment. Both of the characteristics P and PA show an S parameter S21.

In the simulation, six amplifiers An were connected in parallel, and the coplanar waveguide calculator CWP shown in FIG. 2 was used as the transmission line WA. This transmission line WA is a CPW having a signal line width W=2 μm, a gap width G=20 μm, a thickness T=2.4 μm, and a length L=35 μm. Further, a substrate forming the CPW is a dielectric substrate having a substrate thickness H=139 μm, a relative permittivity $\varepsilon_r=3.7$, a magnetic permeability $u_o=1$, a conductivity $G=8\times10^8$ and a dielectric loss tangent tan δ=0.05.

In the characteristics P and PA, a DC gain is 10 dB. For this reason, a −3 dB band (7 dB) is 168 GHz for the characteristic P and 255 GHz for the characteristic PA. Therefore, according to the present embodiment, it is understood that the frequency characteristic can be greatly widened over about 50% as compared with the conventional configuration.

Effects of First Embodiment

As described above, the present embodiment is configured such that the plurality of amplifiers A1, A2, A3, ..., and AN configured with cascode stages, which are connected in parallel between the input side transmission line W1 and the output side transmission line W2, are provided, the transmission line WA is connected to the input terminal (base terminal) of the output transistor Q2 of each of the amplifiers An, and the bias potential Vb2 is applied from the bias circuit B to the input terminal of the output transistor Q2 via the transmission line WA.

With this, the impedance of the transmission line WA increases on the high frequency side of the operating signal frequency band, and positive feedback is applied from the emitter terminal to the collector terminal of output transistor Q2 via the parasitic capacitance Cbc between the base and collector of output transistor Q2 and the parasitic capacitance Cbe between the base and emitter. For this reason, a peaking effect is obtained on the high frequency side of the operating signal frequency band, and as a result, a gain reduction on the high frequency side can be compensated for. Therefore, a wider band distributed amplifier 10 can be realized.

Further, in the present embodiment, the planar waveguide, specifically, the coplanar waveguide calculator may be used for the transmission line WA. As a result, the WA having stable characteristics can be easily formed on the dielectric substrate of the integrated circuit included in the amplifier An.

Further, in the present embodiment, an equivalent inductance value realized by the transmission line WA may be set within a range of 20 pH to 25 pH. As a result, as shown in FIG. 4, the −3 dB band can be greatly expanded, and an extremely wider band distributed amplifier 10 can be realized.

Second Embodiment

Figure 5:
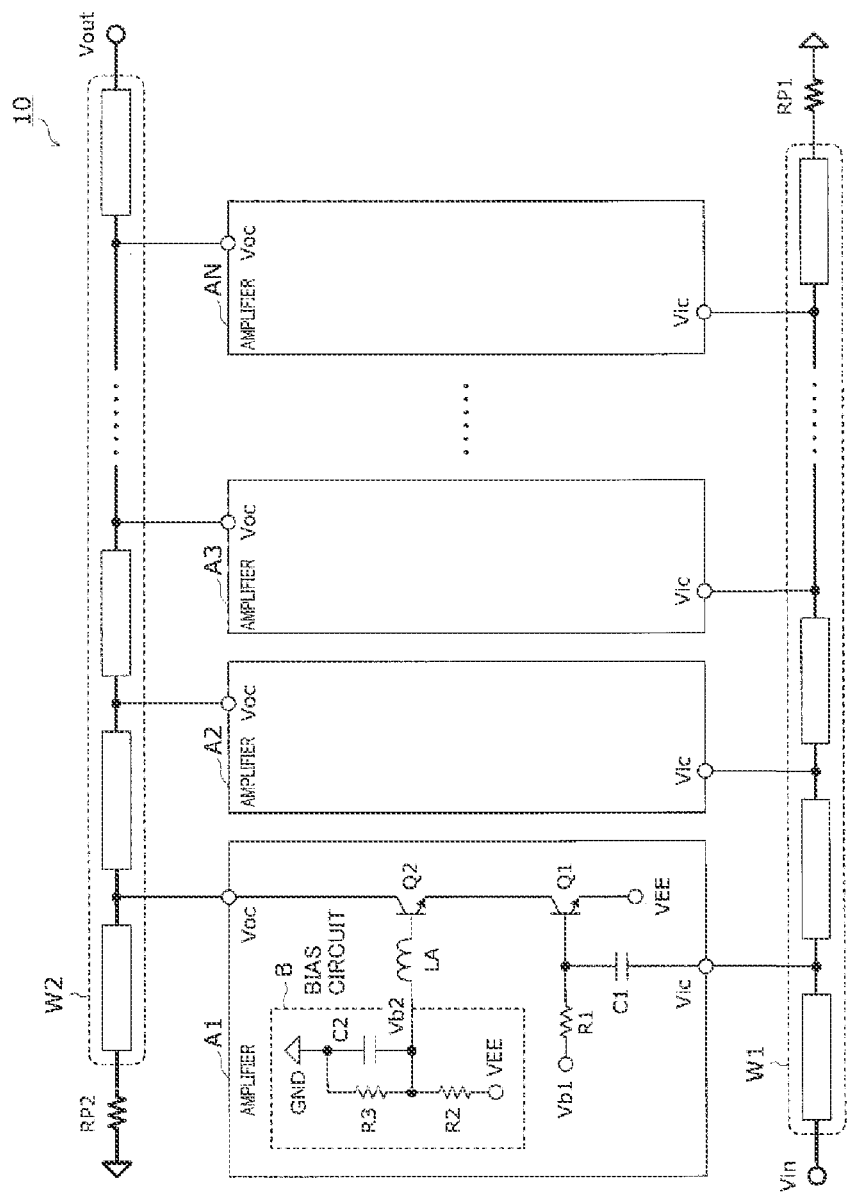
FIG. 5 is a circuit diagram showing a configuration of a distributed amplifier according to a second embodiment.

Next, a distributed amplifier 10 according to a second embodiment of the present invention will be described with reference to FIG. 5. FIG. 5 is a circuit diagram showing a configuration of the distributed amplifier according to the second embodiment.

In the first embodiment, the case in which the planar waveguide such as the CPW is used for the transmission line WA of the amplifier An has been described as an example. In the present embodiment, a case in which an inductor LA is used for the transistor line WA will be described.

As shown in FIG. 5, in the present embodiment, the amplifier An includes the input transistor Q1 and the output transistor Q2 which are cascode-connected to each other, an inductor LA connected to the input terminal (base terminal) of output transistor Q2, and the bias circuit B which applies a bias potential to the input terminal of output transistor Q2 via the inductor LA.

The inductor LA may be a general high frequency coil, a so-called plane coil in which a signal conductor formed on a surface of a dielectric substrate used in an integrated circuit is formed in a spiral shape, or a distributed constant line having a narrow line width for a short distance. Other configurations according to the present embodiment are similar to those of the first embodiment, and detailed descriptions thereof will be omitted here.

Operation of Second Embodiment

Next, an operation of the distributed amplifier 10 according to the present embodiment will be described with reference to FIG. 3 described above.

The inductor LA connected between the bias circuit B and the base terminal of output transistor Q2 is configured as a high frequency waveguide such as a coplanar waveguide calculator, and has a frequency characteristic in which impedance increases on the high frequency side of the operating signal frequency band.

For this reason, the ground impedance of output transistor Q2 becomes relatively high on the high frequency side, and positive feedback is applied from the emitter terminal of output transistor Q2 to the collector terminal. This positive feedback is performed via the parasitic capacitance Cbc between the base and the collector of output transistor Q2 and the parasitic capacitance Cbe between the base and the emitter of output transistor Q2, as shown in FIG. 3.

Therefore, a peaking effect can be obtained on the high frequency side of the operating signal frequency band, and as a result, a gain reduction on the high frequency side can be compensated for. As a result, a wider band distributed amplifier 10 can be realized.

Simulation Results of Second Embodiment

Figure 6:
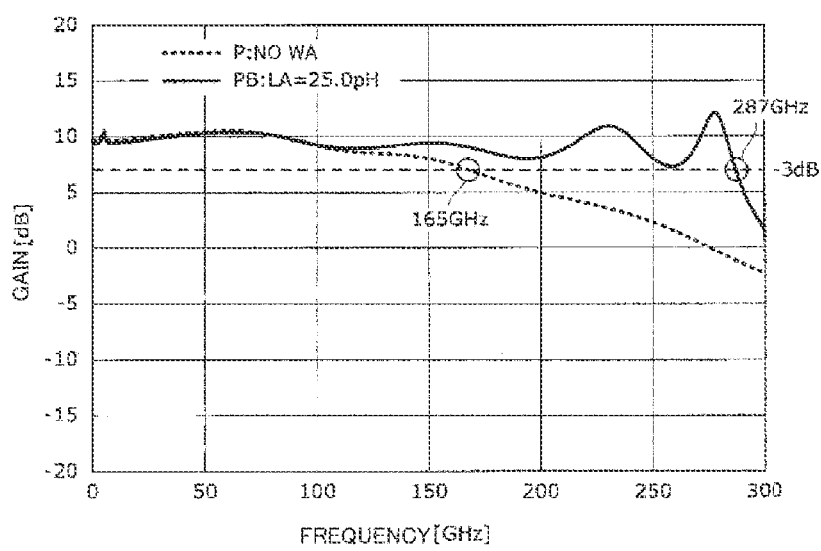
FIG. 6 is a graph showing frequency characteristics (S21) of the distributed amplifier according to the second embodiment.

Next, simulation results of a frequency characteristic of the distributed amplifier 10 according to the present embodiment will be described with reference to FIG. 6. FIG. 6 is a graph showing the frequency characteristic (S21) of the distributed amplifier according to the second embodiment.

In FIG. 6, a characteristic P shows a frequency characteristic of the conventional distributed amplifier 50 shown in FIG. 16, and a characteristic PB shows the frequency characteristic of the distributed amplifier 10 according to the present embodiment. Both of the characteristics P and PB show the S parameter S21.

In the simulation, six amplifiers An were connected in parallel and the inductor LA having an inductance value La=25.0 pH was used.

In the characteristics P and PB, the DC gain is 10 dB. For this reason, the −3 dB band (7 dB) is 168 GHz for the characteristic P and 287 GHz for the characteristic PB. Therefore, according to the present embodiment, it is understood that the frequency characteristic can be greatly widened over about 70% as compared with the conventional configuration.

Figure 7:
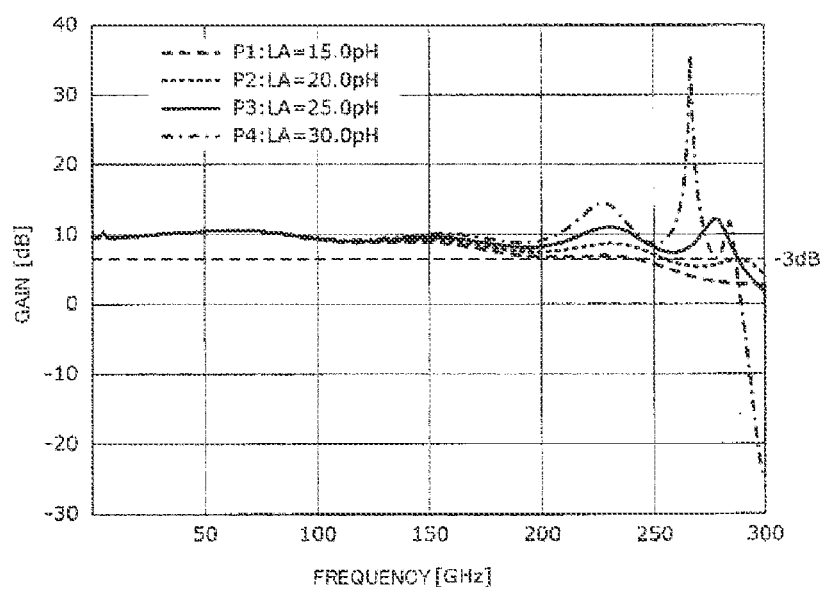
FIG. 7 is a graph showing changes in the frequency characteristics (S21) in FIG. 6 due to an inductance value.

FIG. 7 is a graph showing changes in the frequency characteristic (S21) in FIG. 6 due to the inductance value. In FIG. 7, characteristics P1, P2, P3 (=PB), and P4 are frequency characteristics of the distributed amplifier 10 in a case in which the inductance value La of the inductor LA is changed to La=15.0 pH, 20.0 pH, 25.0 pH, and 30. pH.

In the case of La=15.0 pH, as shown in the characteristic P1, since the peaking effect due to the positive feedback of output transistor Q2 is small, it deviates from the −3 dB band around a portion exceeding 200 GHz, and a rise in a pass characteristic on the high frequency side of the operating signal frequency band is not sufficient. On the other hand, in the case of La=30.0 pH, as shown in the characteristic P4, since the peaking effect is too large, oscillation may occur on the high frequency side, which is not desirable.

For this reason, as shown by the characteristics P2 and P3, it can be seen that, at La=20.0 pH to 25.0 pH, stable and favorable frequency characteristics with the −3 dB band extended to the high frequency side can be obtained.

Further, the optimum range of the inductance value La=20.0 pH to 25.0 pH shown in FIG. 7 is not limited to the inductance value of the inductor LA and can be widely applied as an optimum range of an inductance value regarding the transmission line WA of the amplifier such as the CPW described above, and a microstrip line which will be described later.

Effects of Second Embodiment

As described above, the present embodiment is configured such that the inductor LA is used for the transmission line WA.

For this reason, as compared with the transmission line WA including the planar waveguide such as CPW, stable and favorable frequency characteristics in which the −3 dB band is extended to the high frequency side can be obtained, and as a result, a gain reduction on the high frequency side can be compensated for. Therefore, a wider band distributed amplifier 10 can be realized.

Further, by selecting the inductor LA and the inductance value La of the transmission line WA from the range of 20.0 pH to 25.0 pH, stable and favorable frequency characteristics with the −3 dB band extended to the high frequency side can be obtained.

Third Embodiment

Next, a distributed amplifier 10 according to a third embodiment of the present invention will be described.

In the first embodiment, the case in which the CPW is used for the transmission line WA of the amplifier An has been described as an example. In the present embodiment, a case in which a microstrip line is used for the transmission line WA will be described.

Figure 8:
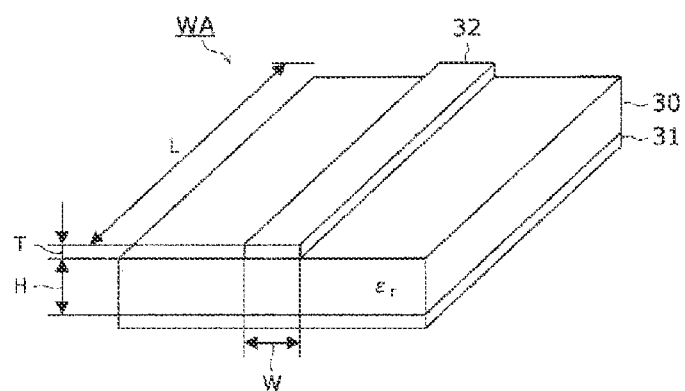
FIG. 8 is a configuration example of a microstrip line.

FIG. 8 is a configuration example of the microstrip line. The microstrip line is one of the planar waveguides and is a waveguide having a structure in which a linear strip conductor 32 is formed on a surface of a dielectric substrate 30 having a ground conductor 31 formed on a back surface thereof. Specifically, as shown in FIG. 8, the ground conductor 31 is provided on one surface of a dielectric having a substrate thickness H and a relative permittivity $\varepsilon_r$, and the strip conductor 32 having a thickness T and a width W is provided on the other surface. Basically, electromagnetic wave is transmitted by concentrating an electromagnetic field in the dielectric substrate between the conductors 31 and 32.

Other configurations according to the present embodiment are the same as those of the first embodiment, and detailed descriptions thereof will be omitted here. Further, an operation and simulation results in a case in which the microstrip line is used for the transmission line WA are the same as those in the first embodiment, and detailed descriptions thereof will be omitted here.

Effects of Third Embodiment

As described above, the present embodiment is configured such that the microstrip line is used for the transmission line WA.

As a result, the same operational effects as when CWP is used can be obtained. Further, in the case of CWP, a layout of a ground (ground potential) may be complicated. However, in the case of the microstrip line, since the ground conductor 31 is provided, the layout of the ground (ground potential) becomes easy.

Fourth Embodiment

Figure 9:
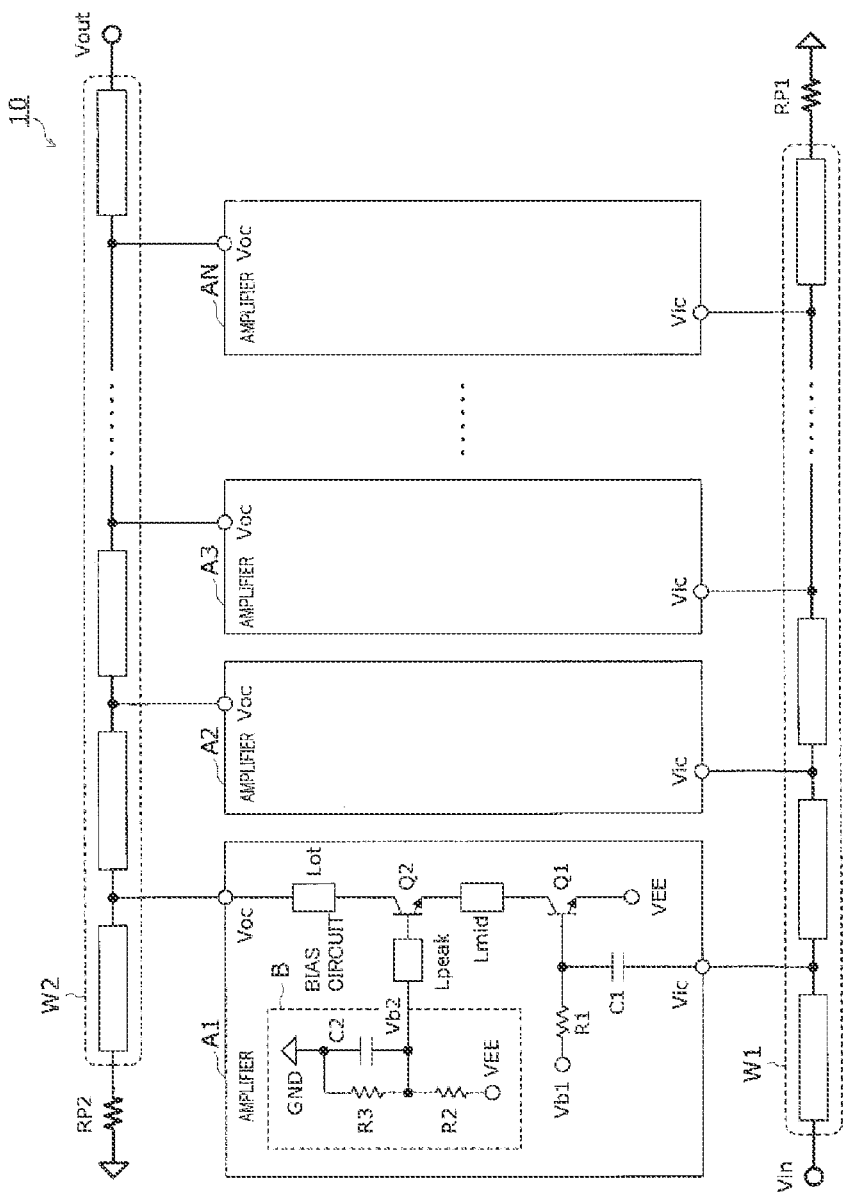
FIG. 9 is a circuit diagram showing a configuration of a distributed amplifier according to a fourth embodiment.

Although the transmission line or the inductor is added to the base terminal of the output transistor Q2 in the first embodiment, a sufficient wider bandwidth cannot be obtained with only one transmission line or inductor added to the base terminal in some cases. In a fourth embodiment, in order to obtain a still wider band, as shown in FIG. 9, transmission lines (Lpeak, Lmid, Lot) having appropriate lengths are added respectively to the base terminal, the emitter terminal, and the collector terminal of the output transistor Q2 of the cascode stage of a unit cell. With such a configuration, it is possible to mix three different peaking frequencies in the frequency characteristics of the unit cell, and thus, by appropriately designing the respective peaking frequencies, an even wider band can be obtained as compared with the case in which only one transmission line is added. Here, similarly to the first embodiment, the transmission lines (Lpeak, Lmid, Lot) may be replaced with inductors having appropriate inductance values.

Effects of Fourth Embodiment

Figure 10:
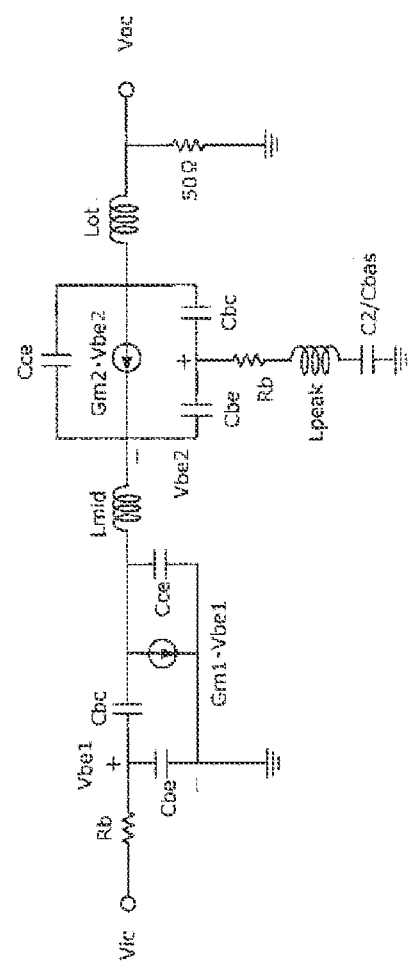
FIG. 10 is a circuit diagram showing a configuration of an equivalent circuit of the distributed amplifier according to the fourth embodiment.

In order to show effects of the present embodiment, a characteristic simulation was performed using a small signal equivalent circuit obtained by simplifying the unit cell shown in FIG. 10. For each parameter, Cbe=Cbc=Cce=6 fF, C2=100 fF, Rb=3Ω, Lpeak=20 pH, Lmid=30 pH, and Lot=10 pH were used.

Figure 11:
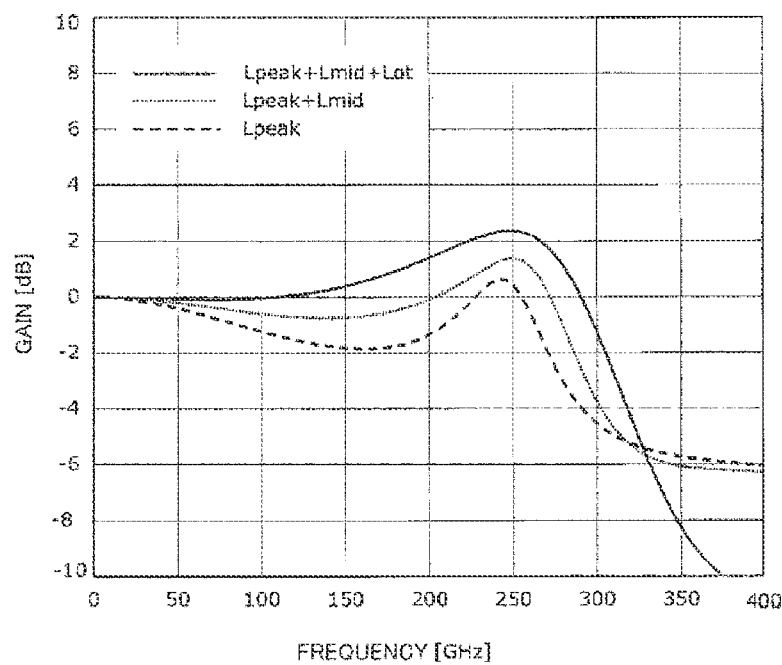
FIG. 11 is a graph showing frequency characteristics of the distributed amplifier according to the fourth embodiment.

FIG. 11 shows simulation results of the frequency characteristic when only the Lpeak is added to the unit cell, when the Lpeak and the Lmid are added, and when the Lpeak, the Lmid, and the Lot are added. It can be seen that an even wider band can be obtained by adding three inductors (Lpeak, Lmid, and Lot) as in the present embodiment.

Fifth Embodiment

Figure 12:
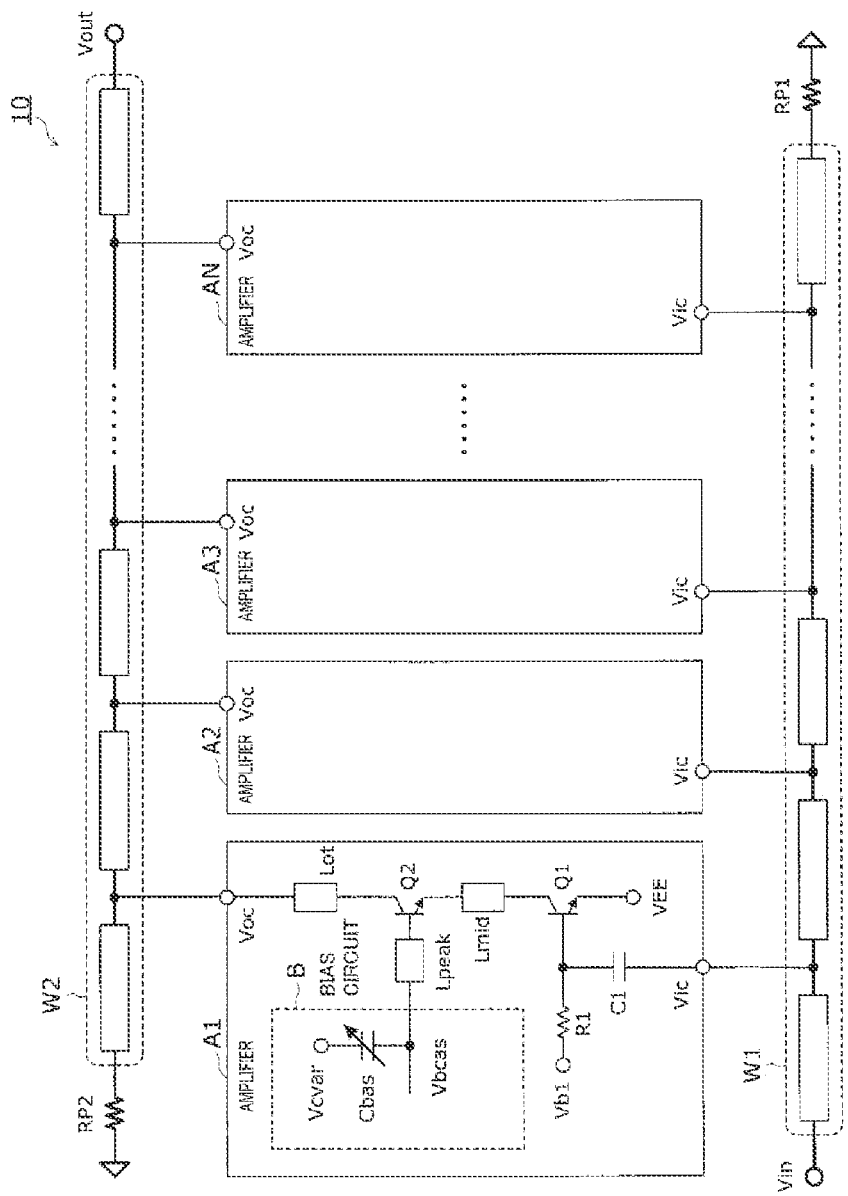
FIG. 12 is a circuit diagram showing a configuration of a distributed amplifier according to a fifth embodiment.

In the distributed amplifier according to the fourth embodiment, a frequency characteristic (in particular, a peaking frequency) after it has been manufactured may be different from that when it was designed due to variations in manufacturing process or the like. It is desirable to have a configuration in which the frequency characteristic such as the peaking frequency can be adjusted after it has been manufactured. In a fifth embodiment, as shown in FIG. 12, the capacitor of the output terminal of the bias circuit connected in parallel to the base terminal of the output transistor Q2 of the cascode stage is configured as a variable capacitor (Cbas) such as a varactor. By changing a capacitance value of the varactor by using a voltage (Vcvar) of a control terminal of the varactor, the peaking frequency can be changed after it has been manufactured, thereby enabling adjustment of the frequency characteristic.

Further, as a configuration with which the frequency characteristic such as the peaking frequency can be adjusted, by changing the voltage (Vbcas) of the base terminal of the output transistor Q2 of the cascode stage (that is, the bias potential of the bias circuit) as shown in FIG. 12, the frequency characteristic can also be adjusted. The parasitic capacitance (Cbc in FIGS. 2 and 10) between the base and the collector of the transistor has a dependency on a voltage between the base and the collector, and particularly in the case of a bipolar transistor, this dependency is remarkable. By controlling the voltage (Vbcas) at the base terminal of the output transistor Q2, the voltage between the base and the collector changes, whereby the parasitic capacitance (Cbc) that determines the peaking frequency changes, and thus, by utilizing this dependency, the frequency characteristic such as the peaking frequency can be changed even after the manufacturing.

Effects of Fifth Embodiment

Figure 13:
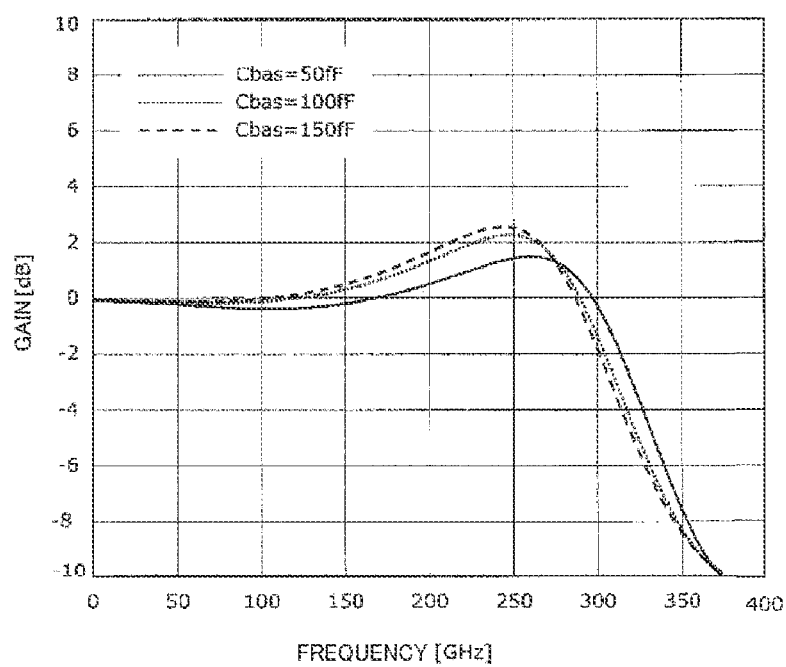
FIG. 13 is a graph showing frequency characteristics of the distributed amplifier according to the fifth embodiment.
Figure 14:
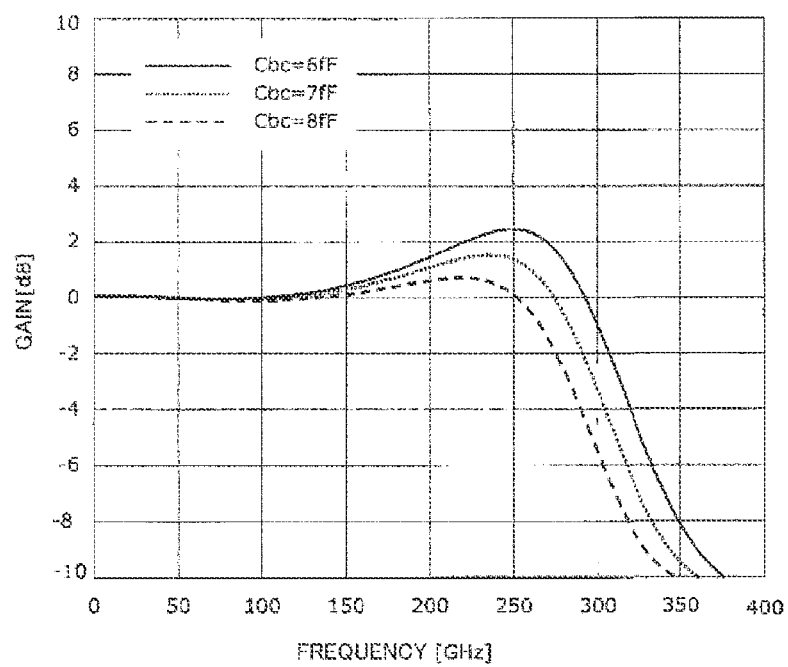
FIG. 14 is a graph showing frequency characteristics of the distributed amplifier according to the fifth embodiment.

FIG. 13 shows simulation results of the frequency characteristic of the unit cell when the capacitance value (Cbas) of the varactor is changed using the equivalent circuit of FIG. 10. By changing the capacitance value of the varactor, the peaking frequency can be changed and the frequency characteristic can be changed. Further, FIG. 14 shows simulation results of the frequency characteristic of the unit cell when the parasitic capacitance (Cbc) is changed by changing the voltage of the base terminal using the equivalent circuit of FIG. 10. It can be seen that the peaking frequency can be changed by changing the parasitic capacitance (Ccb).

Sixth Embodiment

Figure 15:
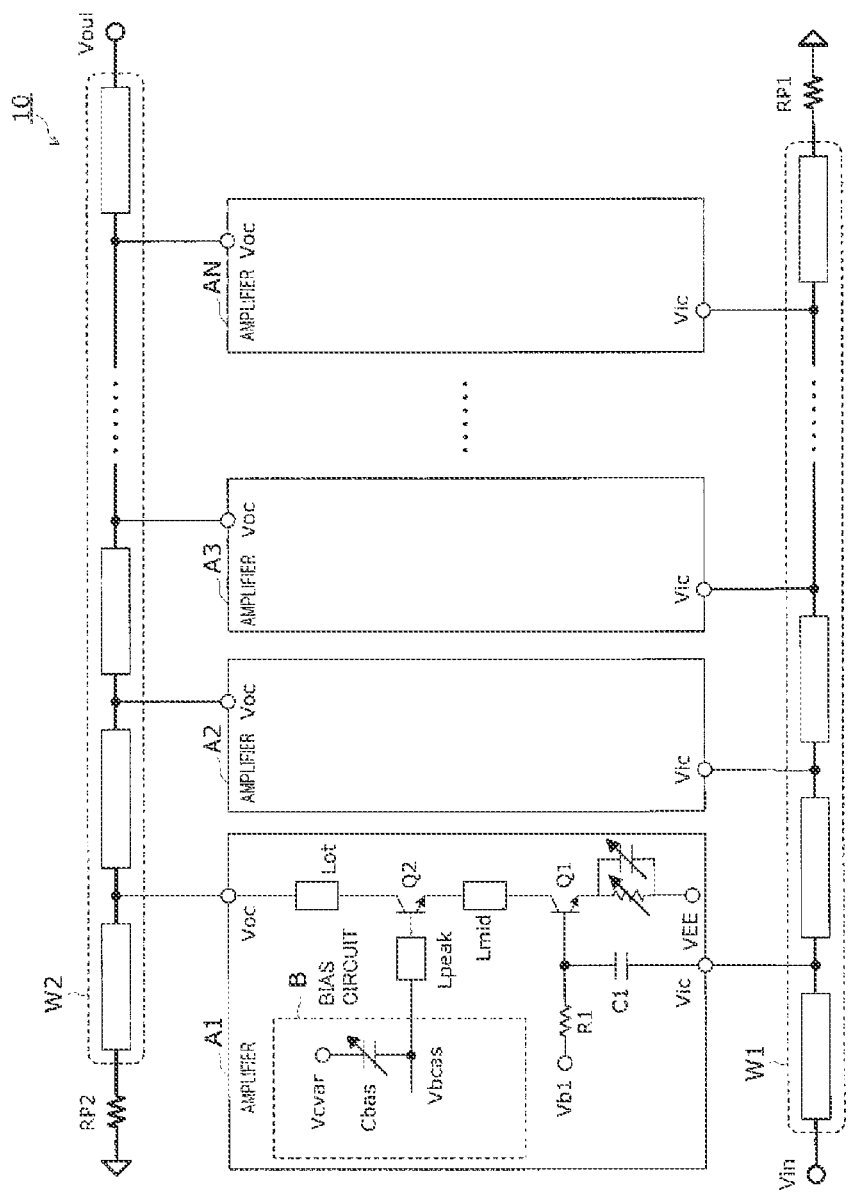
FIG. 15 is a circuit diagram showing a configuration of a distributed amplifier according to a sixth embodiment.

In a sixth embodiment, in addition to the configuration of FIG. 12 of the fifth embodiment, in order to facilitate control to a more desirable frequency characteristic, as shown in FIG. 15, a peaking mechanism in which a parallel circuit of a degeneration resistor and a capacitor is further connected to an input stage of the cascode stage is proposed. According to the present embodiment, in addition to the peaking frequency realized in the fifth embodiment, by adding the peaking frequency on a lower frequency side, it is possible to facilitate control to a more desirable frequency characteristic.

By making a resistance value of the degeneration resistor, the capacitance of the capacitor, or both, variable, and combining them with the adjusting mechanism of FIG. 12 of the fifth embodiment, it is possible to more freely adjust the frequency characteristic after the manufacturing, thereby making it easier to obtain a desired characteristic.

Expansion of Embodiment

Although the present invention has been described with reference to the embodiments, the present invention is not limited to the above embodiments. Various modifications that can be understood by those skilled in the art can be made to the configuration and details of the present invention within the scope of the present invention. In addition, the respective embodiments can be implemented in any combination as long as there is no contradiction. For example, at least one of the configuration of the variable capacitor and the configuration of changing the bias potential of the bias circuit in the fifth embodiment may be applied to the configuration of the first embodiment or the configuration of connecting the parallel circuit of the resistor and the capacitor to the input stage of the cascode stage in the sixth embodiment may be applied to the configurations of the first embodiment and the fourth embodiment.

REFERENCE SIGNS LIST

10 Distributed amplifier
W1 Input side transmission line
W2 Output side transmission line
A1, A2, A3, AN, An Amplifier
Q1 Input transistor
Q2 Output transistor B Bias circuit
WA Transmission line
LA Inductor

The invention claimed is:

1. A distributed amplifier comprising:
an input side transmission line configured to transmit an input signal that is an amplification target;
an output side transmission line configured to transmit an output signal obtained by amplifying the input signal; and
a plurality of amplifiers comprising cascode stages, the amplifiers being connected in parallel between the input side transmission line and the output side transmission line, wherein each of the amplifiers includes:
an input transistor and an output transistor cascode-connected to each other;
a first transmission line connected to a base terminal of the output transistor; and
a bias circuit configured to apply a bias potential to the base terminal of the output transistor via the first transmission line, wherein the bias circuit comprises a first capacitor and a first resistor, the first capacitor and the first resistor being connected in parallel.

2. The distributed amplifier according to claim 1, further comprising:
a second transmission line connected to a collector terminal of the output transistor; and
a third transmission line connected to an emitter terminal of the output transistor.

3. The distributed amplifier according to claim 2, wherein the first to third transmission lines are planar waveguides.

4. The distributed amplifier according to claim 1, wherein the first capacitor is a variable capacitor connected in parallel to an output terminal.

5. The distributed amplifier according to claim 1, wherein the bias circuit is configured such that the bias potential is variable.

6. The distributed amplifier according to claim 1, wherein a parallel circuit of a second resistor and a second capacitor is connected to an emitter terminal of the input transistor.

7. The distributed amplifier according to claim 6, wherein at least one of a resistance value of the second resistor and a capacitance value of the second capacitor is variable.

8. The distributed amplifier according to claim 1, wherein the first transmission line has an inductance value of 20 pH to 25 pH.

9. A distributed amplifier comprising:
an input side transmission line configured to transmit an input signal that is an amplification target;
an output side transmission line configured to transmit an output signal obtained by amplifying the input signal; and
a plurality of amplifiers comprising cascode stages, the amplifiers being connected in parallel between the input side transmission line and the output side transmission line, wherein each of the amplifiers includes:
an input transistor and an output transistor cascode-connected to each other;
a first inductor connected to a base terminal of the output transistor; and
a bias circuit configured to apply a bias potential to the base terminal of the output transistor via the first inductor, wherein the bias circuit comprises a first capacitor and a first resistor, the first capacitor and the first resistor being connected in parallel.

10. The distributed amplifier according to claim 9, further comprising:
a second inductor connected to a collector terminal of the output transistor; and
a third inductor connected to an emitter terminal of the output transistor.

11. The distributed amplifier according to claim 9, wherein the first capacitor is a variable capacitor connected in parallel to an output terminal.

12. The distributed amplifier according to claim 9, wherein the bias circuit is configured such that the bias potential is variable.

13. The distributed amplifier according to claim 9, wherein a parallel circuit of a second resistor and a second capacitor is connected to an emitter terminal of the input transistor.

14. The distributed amplifier according to claim 13, wherein at least one of a resistance value of the second resistor and a capacitance value of the second capacitor is variable.

15. The distributed amplifier according to claim 9, wherein the first inductor has an inductance value of 20 pH to 25 pH.

* * * * *